(12) United States Patent
Lee et al.

(10) Patent No.: US 12,078,888 B2
(45) Date of Patent: Sep. 3, 2024

(54) BACKLIGHT UNIT AND DISPLAY DEVICE INCLUDING THE SAME

(71) Applicant: LG DISPLAY CO., LTD., Seoul (KR)

(72) Inventors: Kyung Ha Lee, Seoul (KR); Sung Woo Choi, Seoul (KR); Nam Kook Kim, Suwon-si (KR)

(73) Assignee: LG DISPLAY CO., LTD., Seoul (KR)

( * ) Notice: Subject to any disclaimer, the term of this patent is extended or adjusted under 35 U.S.C. 154(b) by 369 days.

(21) Appl. No.: 17/532,198

(22) Filed: Nov. 22, 2021

(65) Prior Publication Data

US 2022/0163852 A1 May 26, 2022

(30) Foreign Application Priority Data

Nov. 26, 2020 (KR) .................... 10-2020-0161709

(51) Int. Cl.
*G02F 1/1335* (2006.01)
*G02F 1/13357* (2006.01)
*H01L 25/075* (2006.01)
*H01L 33/62* (2010.01)

(52) U.S. Cl.
CPC .. *G02F 1/133612* (2021.01); *G02F 1/133603* (2013.01); *H01L 25/0753* (2013.01); *H01L 33/62* (2013.01)

(58) Field of Classification Search
CPC .............................. H01L 33/387; H01L 33/36
See application file for complete search history.

(56) References Cited

U.S. PATENT DOCUMENTS

| 7,589,351 B2 * | 9/2009 | Hsieh | H01L 33/38 257/E33.068 |
| 2007/0228386 A1 * | 10/2007 | Shie | H01L 33/486 257/E33.072 |
| 2008/0035948 A1 * | 2/2008 | Shin | H01L 24/29 257/E33.058 |
| 2009/0278131 A1 * | 11/2009 | Kwon | H01L 27/1288 438/34 |
| 2011/0303936 A1 * | 12/2011 | Wu | H01L 33/62 438/27 |
| 2015/0043175 A1 * | 2/2015 | Choi | H05K 1/0283 174/254 |
| 2016/0247982 A1 * | 8/2016 | Ting | H01L 33/62 |

(Continued)

FOREIGN PATENT DOCUMENTS

| JP | 2020-095995 A | 6/2020 |
| KR | 10-0702430 B1 | 4/2007 |
| KR | 10-0843787 B1 | 7/2008 |

(Continued)

OTHER PUBLICATIONS

Korean Office Action dated Jan. 18, 2024 issued in Patent Application No. 10-2020-0161709 (5 pages).

*Primary Examiner* — Andrew J Coughlin
(74) *Attorney, Agent, or Firm* — POLSINELLI PC

(57) ABSTRACT

A display device including a backlight unit that includes a barrier layer disposed between a light-emitting chip and an electrode pad to reduce the contact area between a solder and the electrode pad due to the barrier layer, so that a portion of the electrode pad overlapping with the barrier layer is left behind without being diffused into the solder, and rework can be performed on a process of mounting the light-emitting chip.

24 Claims, 16 Drawing Sheets

(56) References Cited

U.S. PATENT DOCUMENTS

2020/0343271 A1* 10/2020 Kao .................... H01L 23/5384
2021/0005588 A1* 1/2021 Chung .................... H01L 24/95

FOREIGN PATENT DOCUMENTS

| KR | 10-0999736 B1 | 12/2010 |
| KR | 10-2019-0092331 A | 8/2019 |
| WO | WO 01/47036 | 6/2001 |

* cited by examiner

BACKLIGHT UNIT AND DISPLAY DEVICE INCLUDING THE SAME

CROSS-REFERENCE TO RELATED APPLICATION

This application claims the benefit of Korean Patent Application No. 10-2020-0161709, filed on Nov. 26, 2020, which is hereby incorporated by reference in its entirety as if fully set forth herein.

BACKGROUND

Field of the Disclosure

The present disclosure relates to a backlight unit and a display device including the same, and more particularly to a backlight unit and a display device including the same capable of reducing the thickness thereof.

Description of the Background

Nowadays, with the advent of information society, the requirements for display devices for representing information are increasing. Various types of display devices, such as liquid crystal display devices and organic light-emitting display devices, have recently been used.

Among such display devices, a liquid crystal display device displays an image by allowing light radiated from a backlight unit to pass through a display panel while adjusting the orientation of liquid crystals of a liquid crystal layer of the display panel by controlling an electric field applied to the liquid crystal layer.

The backlight unit may be categorized into a side-edge-type backlight unit and a direct-light-type backlight unit depending on the position of a light source.

The side-edge-type backlight unit is configured such that a light source is located at a side of a light guide plate disposed below a liquid crystal panel, side light from the light source is converted into planar light by the light guide plate, and the planar light is radiated to the liquid crystal panel. However, since the light source is located on the side, it is difficult to implement local dimming in which the backlight unit is divided into a plurality of regions and driven for each region.

The direct-light-type backlight unit is configured such that a plurality of light sources is disposed under a liquid crystal panel and light from the light sources is directly radiated to the entire surface of the liquid crystal panel. The direct-light-type backlight unit can improve uniformity and brightness of light radiated to the liquid crystal panel and implement local dimming, thereby improving a contrast ratio and reducing a power consumption.

However, in the direct-light-type backlight unit, since the light sources are disposed under the liquid crystal panel, the thickness of the backlight unit can be increased.

SUMMARY

Accordingly, the present disclosure is directed to a backlight unit and a display device including the same that substantially obviate one or more problems due to limitations and disadvantages of the related art.

More specifically, the present disclosure is to provide a backlight unit and a display device including the same capable of reducing the thickness thereof.

Additional advantages and features of the disclosure will be set forth in part in the description which follows and in part will become apparent to those having ordinary skill in the art upon examination of the following or may be learned from practice of the disclosure. Other advantages of the disclosure may be realized and attained by the structure particularly pointed out in the written description and claims hereof as well as the appended drawings.

To achieve these features and other advantages and in accordance with the purpose of the disclosure, as embodied and broadly described herein, a backlight unit includes an electrode pad disposed on a substrate, a plurality of light-emitting chips mounted on the substrate, a solder disposed between the electrode pad and the plurality of light-emitting chips, and a barrier layer disposed between the electrode pad and the solder, the barrier layer having at least one slit.

The barrier layer may be formed of a material having lower reactivity with the solder than the material of the electrode pad.

The backlight unit may further include a driving electrode, disposed on the substrate and connected to the electrode pad, and a protective film, disposed on the driving electrode so as to expose the electrode pad. The protective film may be made of an inorganic insulating material, and the barrier layer may be formed of the same material and in the same plane as the protective film.

The barrier layer and the protective film may be made of silicon nitride (SiNx) or silicon oxide (SiOx).

The electrode pad may be formed in a multi-layered structure. The barrier layer may be disposed on the electrode pad, and may be made of the same material as any one of multiple layers included in the electrode pad.

The barrier layer may be formed in a single-layered structure or a multi-layered structure using one selected from the group consisting of molybdenum-titanium alloy (MoTi), titanium (Ti), molybdenum (Mo), silver (Ag), and an alloy thereof.

The electrode pad may include first and second conductive layers sequentially stacked. Each of the barrier layer and the first conductive layer may be formed in a single-layered structure or a multi-layered structure using at least one of molybdenum-titanium alloy (MoTi), titanium (Ti), molybdenum (Mo), or silver (Ag). The second conductive layer may be formed in a single-layered structure or a multi-layered structure using copper (Cu).

The backlight unit may further include a third conductive layer disposed on the barrier layer. The third conductive layer may be made of the same material as the second conductive layer.

The barrier layer may include multiple pores, and the multiple pores may be combined to form the at least one slit. The barrier layer may have a density lower than the density of the first conductive layer.

The backlight unit may further include a reflective layer disposed between the plurality of light-emitting chips and under the plurality of light-emitting chips. The reflective layer may be formed in an uneven shape.

A portion of the upper surface of the electrode pad, overlapping the barrier layer, may have a flat surface.

A portion of the upper surface of the electrode pad, not overlapping the barrier layer, may have a non-flat surface.

The electrode pad includes first and second conductive layers sequentially stacked. The first conductive layer is formed in a single-layered structure or a multi-layered structure using copper (Cu), and the second conductive layer is formed in a single-layered structure or a multi-layered structure using at least one of molybdenum-titanium alloy (MoTi), titanium (Ti), molybdenum (Mo), or silver (Ag). The barrier layer is formed of the same layer as the second conductive layer.

The barrier layer is formed by patterning the second conductive layer.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspect(s) of the disclosure and together with the description serve to explain the principle of the disclosure.

In the drawings.

DETAILED DESCRIPTION

Reference will now be made in detail to exemplary aspects of the present disclosure, examples of which are illustrated in the accompanying drawings.

Figure 1:
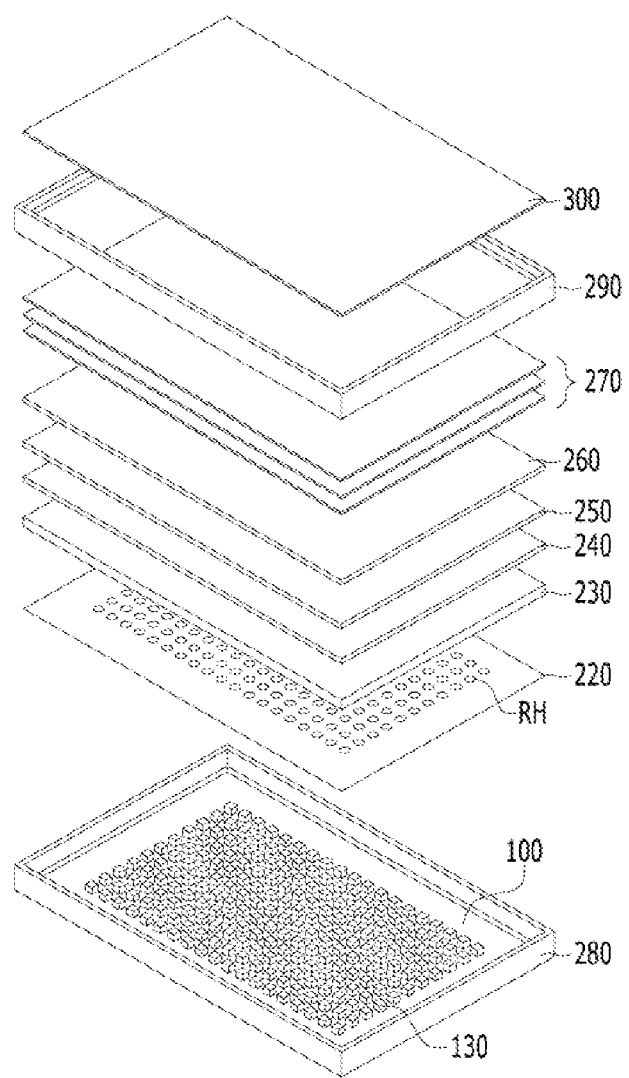
FIG. 1 is a perspective view showing a liquid crystal display module according to a first aspect of the present disclosure.
Figure 2:
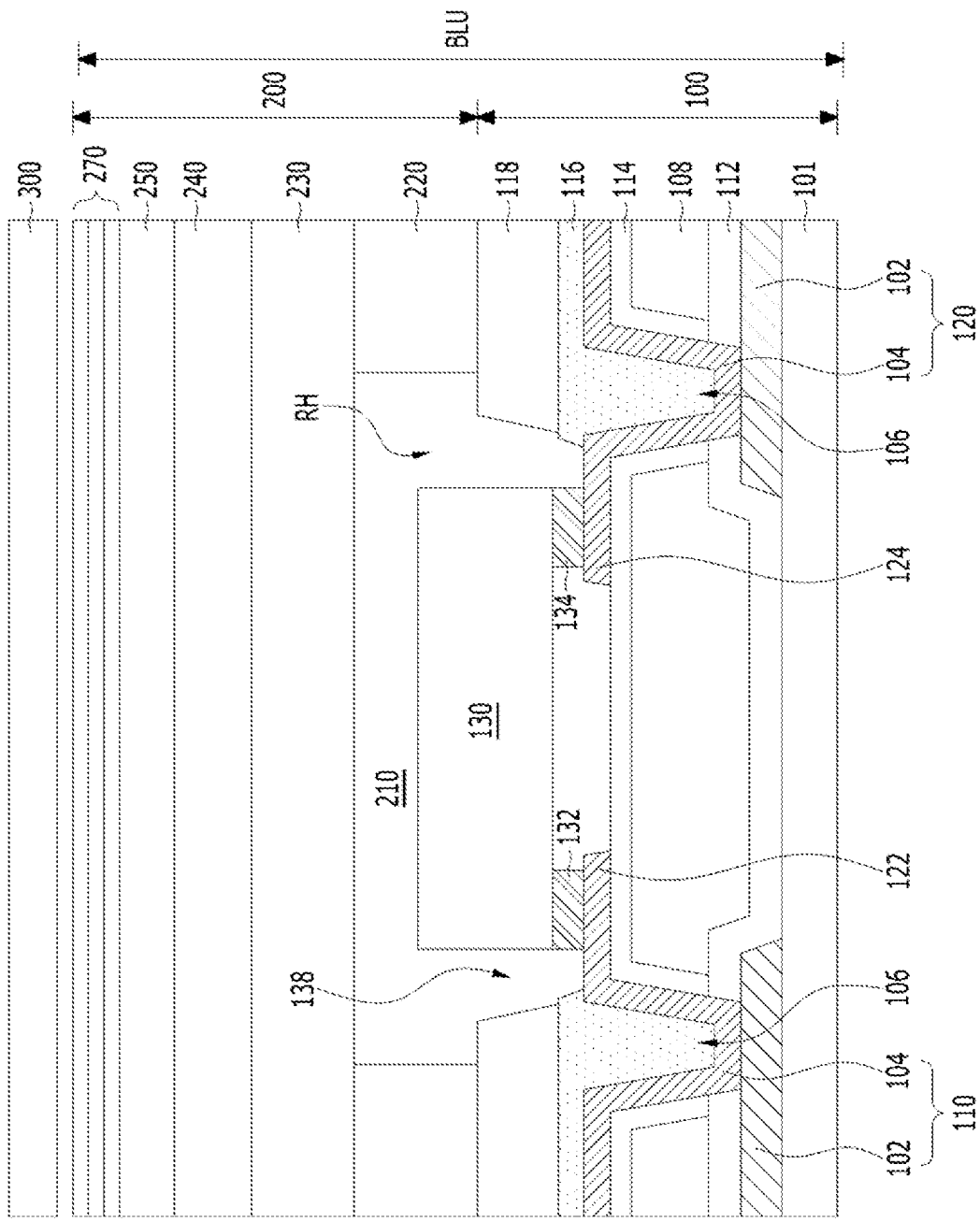
FIG. 2 is a cross-sectional view showing the liquid crystal display module shown in FIG. 1.

FIG. 1 is a perspective view showing a liquid crystal display module according to the present disclosure, and FIG. 2 is a cross-sectional view showing the display module according to the present disclosure.

Referring to FIGS. 1 and 2, a liquid crystal display module according to the present disclosure includes a lower case 280, a backlight unit BLU, a panel guide 290, and a liquid crystal panel 300.

The lower case 280 accommodates the backlight unit BLU and supports the panel guide 290. The lower case 280 may be made of a metal material in order to dissipate the heat generated from a light-emitting chip 130.

The backlight unit BLU is disposed under the liquid crystal panel 300 and radiates light to the lower surface of the liquid crystal panel 300. The backlight unit BLU includes a light-emitting plate 100 and an optical unit 200.

The light-emitting plate 100 may include a substrate 101, a planarization layer 108, first and second insulating layers 112, 114 and a reflective layer 118. The optical unit 200 may include a reflective film 220 with a plurality of light-emitting chip holes RH, a diffusion plate 230, a light control film 240, a fluorescent sheet 250, and an optical sheet 270. More detailed explanations for configurations of the light emitting plate 100 will be provided with FIGS. 3 and 4 below.

Figure 3:
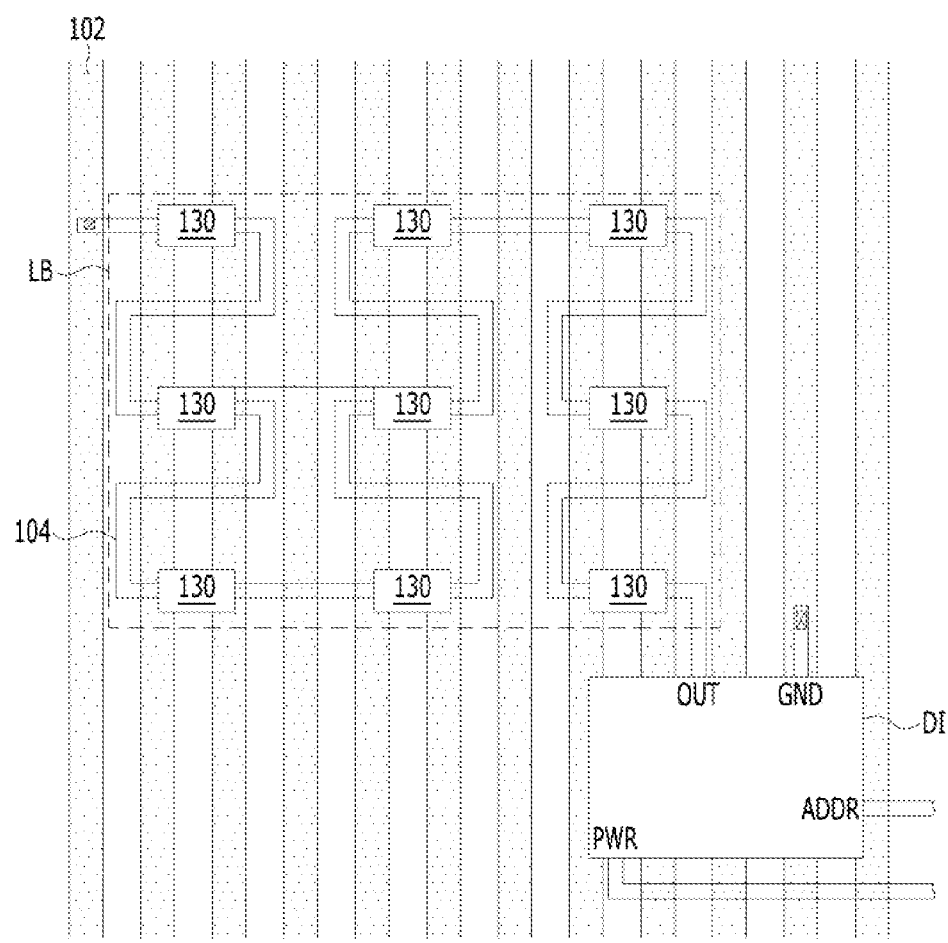
FIG. 3 is a plan view showing the light-emitting chip and the light-emitting driving circuit shown in FIG. 2.
Figure 4:
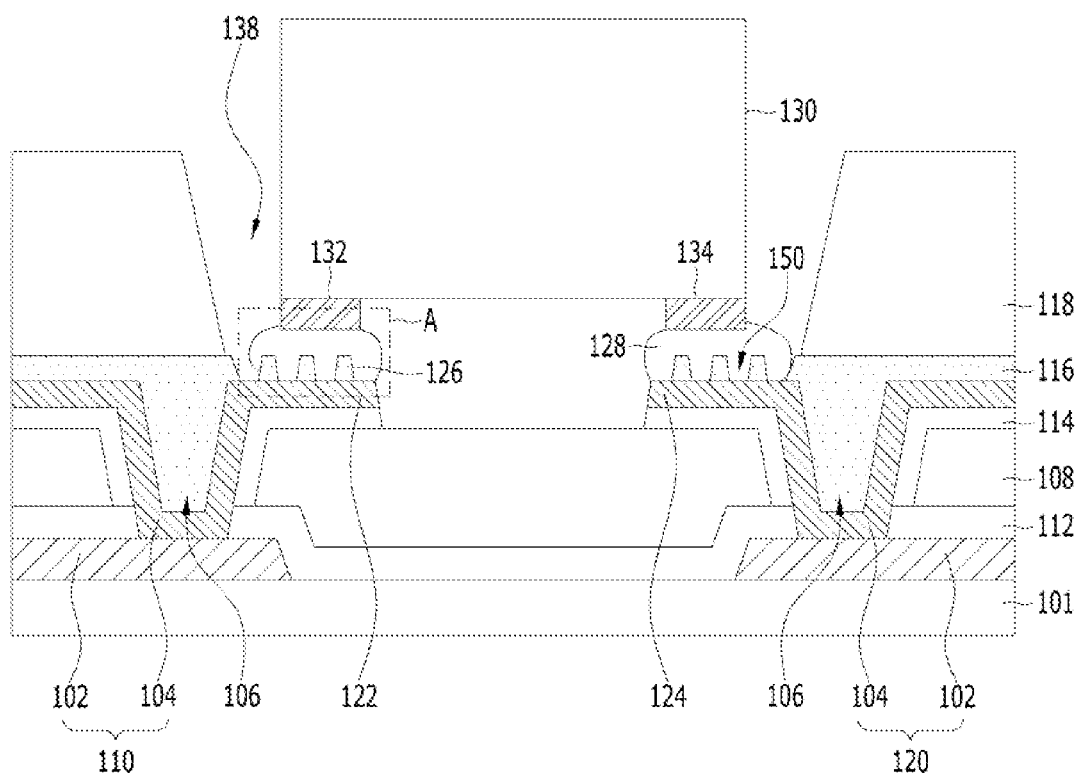
FIG. 4 is a cross-sectional view showing the light-emitting plate shown in FIG. 2 in detail.

FIG. 3 is a plan view showing the light-emitting chip and the light-emitting driving circuit shown in FIG. 2, and FIG. 4 is a cross-sectional view showing the light-emitting plate shown in FIG. 2 in detail.

As shown in FIG. 3, a plurality of light-emitting chips 130 and a light-emitting driver DI may be disposed on the substrate 101 of the light-emitting plate 100.

The substrate 101 may be disposed on the lower case 280, and the plurality of light-emitting chips 130 may be mounted on the substrate 101. The substrate 101 may be formed of a transparent material. For example, the substrate 101 may be formed of a glass material, so that it can be formed thinner than a conventional printed circuit board (PCB). However, the substrate 101 is not limited to any specific material and it can be any materials other than the glass material. For example, the substrate 101 may be formed of a plastic material.

As shown in FIG. 3, the light-emitting chip 130 may be provided in a plural number, and each of the light-emitting chips 130 may be formed as a light-emitting diode (LED). The light-emitting chips 130 are disposed on the substrate 101 so as to be spaced apart from one another, thereby forming light-emitting blocks LB. For example, at least two light-emitting chips 130 may be connected in series for each light-emitting block LB. The light-emitting blocks LB may simultaneously emit light or may be individually driven in response to a driving signal from the light-emitting driver DI.

An encapsulation layer 210 (shown in FIG. 2) is disposed on the substrate 101 on which the light-emitting blocks LB are mounted. The encapsulation layer 210 may be coated on the substrate 101 to a thickness greater than the thickness of the light-emitting chip 130 in order to cover the light-emitting blocks LB mounted on the substrate 101. The encapsulation layer 210 may reliably fixe the light-emitting blocks LB to the substrate 101 and protects the light-emitting blocks LB from an outside impact. To this end, the encapsulation layer 210 is formed of a resin-based material such as silicon (Si), ultraviolet (UV) resin, polycarbonate (PC), polymethyl methacrylate (PMMA), and combinations thereof.

The light-emitting driver DI causes the light-emitting chips 130 to emit light with supplying a driving power supplied from the outside to each of the light-emitting blocks LB. The light-emitting driver DI may include power terminals PWR and GND for receiving a driving voltage and a ground voltage supplied from a power supply, an output terminal OUT for outputting the driving voltage to the light-emitting blocks LB, and an address terminal ADDR for receiving an address signal for selectively controlling the ON/OFF operation of the light-emitting blocks LB. Each of the light-emitting blocks LB and the light-emitting driver DI transmits and receives a driving signal through first and second driving electrodes 102 and 104 formed on the substrate 101.

The optical unit 200 may include a reflective film 220, a diffusion plate 230, a light control film 240, a fluorescent sheet 250 and an optical sheet 270.

More specifically, the reflective film 220 is disposed on the substrate 101. The reflective film 220 is made of a reflective material and reflects the light emitted from the light-emitting chips 130 toward the diffusion plate 230. The reflective film 230 may have therein a plurality of light-emitting chip holes RH. Since the light-emitting chip holes RH are disposed to have one-to-one correspondence with the light-emitting chips 130, the light-emitting chips 130 may be inserted into the light-emitting chip holes RH.

The diffusion plate 230 is supported by the lower case 280, and is disposed so as to cover the front surface of the lower case 280. The diffusion plate 230 is formed in a flat plate shape having a predetermined thickness, and serves to diffuse the light emitted from each of the light-emitting chips 130 so that the light travels toward the liquid crystal panel 300.

The light control film 240 enables the light generated by the light-emitting chips 130 to be directly recognized by the liquid crystal panel 300, thereby preventing the light from being recognized as mura such as a hot spot. To this end, the light control film 240 may include a region having a high reflectivity and a region having a low reflectivity. A lens-shaped pattern may be formed in the region having a high reflectivity.

The fluorescent sheet 250 may include at least one fluorescent substance absorbing a portion of first color light generated by the light-emitting chips 130 and generating light of at least one second color different from the first color. In the case of using the fluorescent sheet 250, the first color light generated by the light-emitting chips 130 and the light of the color generated by the fluorescent sheet 250 are mixed to finally produce white light, and the white light is provided to the liquid crystal panel 300. For example, when the fluorescent sheet 250 includes a yellow fluorescent substance, the blue light generated by the light-emitting chips 130 is converted into white light by the fluorescent sheet 250 including a yellow fluorescent substrate. Alternatively, when the light-emitting chips 130 generate white light, the fluorescent sheet 250 may be omitted.

The optical sheet 270 serves to direct the light toward the liquid crystal panel 300 by condensing and diffusing the light, thereby increasing the luminance of the liquid crystal panel 300. The optical sheet 270 may include a lower diffusion sheet, a prism sheet, and an upper diffusion sheet. However, such a configuration is not limited thereto. For example, the optical sheet 270 may be configured as a stacked combination of two or more sheets including a diffusion sheet, a prism sheet, a dual brightness enhancement film, and a lenticular sheet.

The prism sheet may include a plurality of prism patterns formed in parallel to have a triangular-shaped cross-section, wherein a maintain portion and a valley portion of the prism pattern may be rounded at a predetermined curvature. A lenticular lens sheet may include a plurality of lenticular lens patterns formed in parallel to have a semicircular-shaped or semielliptical-shaped cross-section having a predetermined curvature. A micro lens sheet may include a plurality of micro lens patterns formed at a predetermined height to have a semicircular or semielliptical shape. The optical sheet 270 may further include a protective sheet for protecting the optical sheet 270.

The panel guide 290 may be disposed so as to surround the liquid crystal panel 300 and the backlight unit BLU while supporting the rear edge of the liquid crystal panel 300.

The liquid crystal panel 300 drives a liquid crystal layer (not shown in the drawings) according to an electric field generated for each subpixel by a data voltage and a common voltage applied to each subpixel, thereby displaying a predetermined color image according to the light transmittance of the liquid crystal layer.

As shown in FIG. 4, the light-emitting plate 100 of the liquid crystal display module may include a substrate 101, first and second driving electrodes 110 and 120, first and second electrode pads 122 and 124, a reflective layer 118, and a barrier layer 126.

The substrate 101 serves as a support substrate. The substrate 101 may be made of a transparent and flexible film material such as plastic, ceramic and glass. When the substrate 101 is made of a plastic material, the substrate 101 may be made of one of polyimide (PI), polyethylene (PE), polyethylene naphthalene (PEN), polyethylene terephthalate (PET), and acrylic.

Each of the first and second driving electrodes 110 and 120 includes upper and lower conductive layers 102 and 104, which are connected to each other through a contact hole 106. Each of the upper and lower conductive layers 102 and 104 may be formed in a single-layered structure or a multi-layered structure including aluminum (Al), copper (Cu), silver (Ag), gold (Au), chromium (Cr), tungsten (W), molybdenum (Mo), titanium (Ti), and an alloy including any of these elements as a main component. The lower conductive layer 102 is formed on the substrate 101. The upper conductive layer 104 may be electrically connected to the lower conductive layer 102 exposed through the contact hole 106 which penetrates the first and second insulating layers 112 and 114.

The first and second insulating layers 112 and 114 may be formed of an inorganic insulating material such as silicon nitride (SiNx) and silicon oxide (SiOx). Further, the first and second insulating layers 112 and 114 may be disposed so as to surround the upper surface, the lower surface, and the side surfaces of the planarization layer 108 which is made of an organic insulating material.

The first insulating layer 112 is disposed on the side surfaces and the upper surface of the lower conductive layer 102 in order to prevent the lower conductive layer 102 from contacting the planarization layer 108. Accordingly, the metal included in the lower conductive layer 102 can be prevented from being diffused into the planarization layer 108.

The second insulating layer 114 is disposed on the side surfaces and the upper surface of the planarization layer 108 in order to prevent the upper conductive layer 104 from contacting the planarization layer 108. Accordingly, the metal included in the upper conductive layer 104 is prevented from being diffused into the planarization layer 108 which is made of an organic insulating material. In addition, since the second insulating layer 114 is disposed on the side surfaces and the upper surface of the planarization layer 108, a peeling-off defect of the planarization layer 108 can be prevented.

The protective film 116 may be disposed on the upper conductive layer 104. In addition, the protective film 116 may include an opening to expose the first and second electrode pads 122 and 124. The protective film 116 may be formed of an inorganic insulating material such as silicon nitride (SiNx) and silicon oxide (SiOx). The protective film 116 may be formed in a single-layered structure or a multi-layered structure. When the protective film 116 is formed in a multi-layered structure, the protective film 116 may be formed by stacking a silicon nitride (SiNx) film and a silicon oxide (SiOx) film. The protective film 116 can prevent the reflective layer 118 from contacting the upper conductive layer 104, thereby preventing the metal included in the upper conductive layer 104 from being diffused into the reflective layer 118.

The reflective layer 118 may have a through-hole 138 corresponding to an area in which the light-emitting chip 130 is mounted. The reflective layer 118 reflects light emitted from the side surfaces of the light-emitting chip 130 so that the light travels in the front direction of the liquid crystal display module. The reflective layer 118 may be made of an organic insulating material. In addition, the through-hole 138 in the reflective layer 118 overlaps with the opening in the protective film 116.

Each of the first and second electrode pads 122 and 124 is formed by extending from the upper conductive layer 104, and thus is made of the same material as the upper conductive layer 104. Each of the first and second electrode pads 122 and 124 is formed on the second insulating layer 114 which is disposed so as to cover the planarization layer 108. Since the first and second electrode pads 122 and 124 are disposed on the upper surface of the second insulating layer 114 planarized by the planarization layer 108, the light-emitting chip 130 is stably mounted during a soldering process. The first and second electrode pads 122 and 124 may be exposed by the opening in the protective film 116 and the through-hole 138 in the reflective layer 118. Accordingly, the exposed first electrode pad 122 is electrically connected to a first chip pad 132 of the light-emitting chip 130 via a solder 128, and the exposed second electrode pad 124 is electrically connected to a second chip pad 134 of the light-emitting chip 130 via the solder 128 (as shown in area A). The barrier layer 126 can reduce a contact area between the first and second electrode pads 122 and 124 and the solder 128, so that a rework process can be facilitated when a soldering process is defective or a process of mounting the light-emitting chip 130 is defective. The barrier layer 126 may be referred to as a rework mount unit.

FIGS. 5A to 5D are plan views showing various shapes of the barrier layer shown in FIG. 4.

Figure 5A:
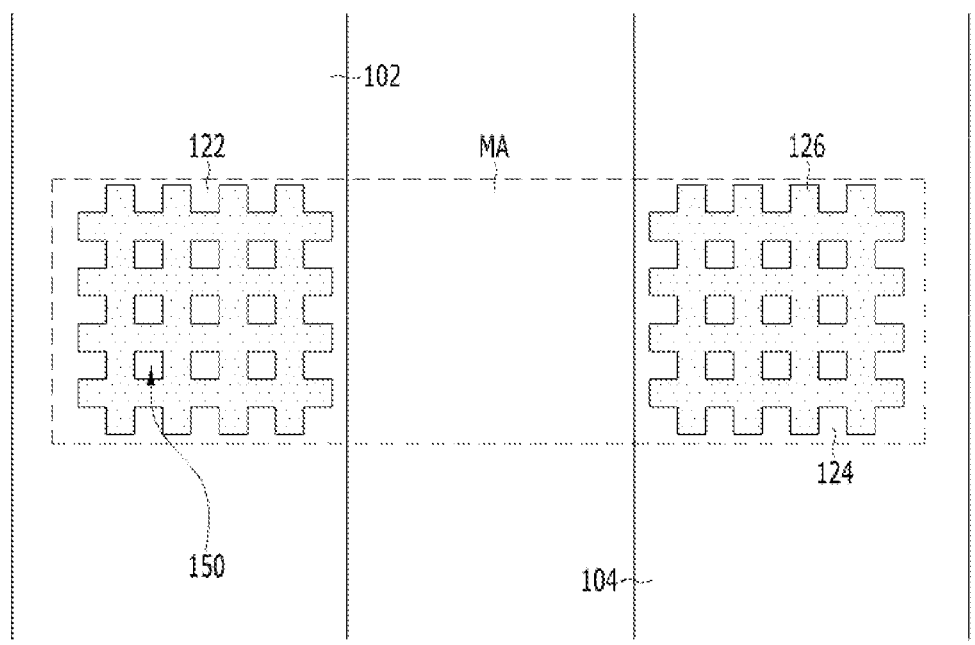
FIGS. 5A to 5D are plan views showing aspects of the barrier layer shown in FIG. 4.
Figure 5B:
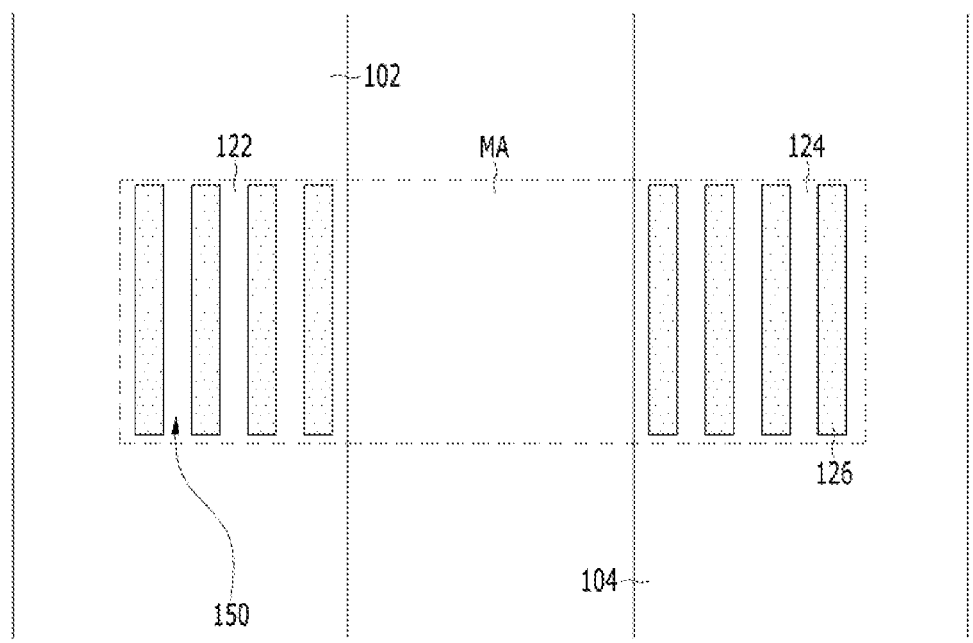
Figure 5C:
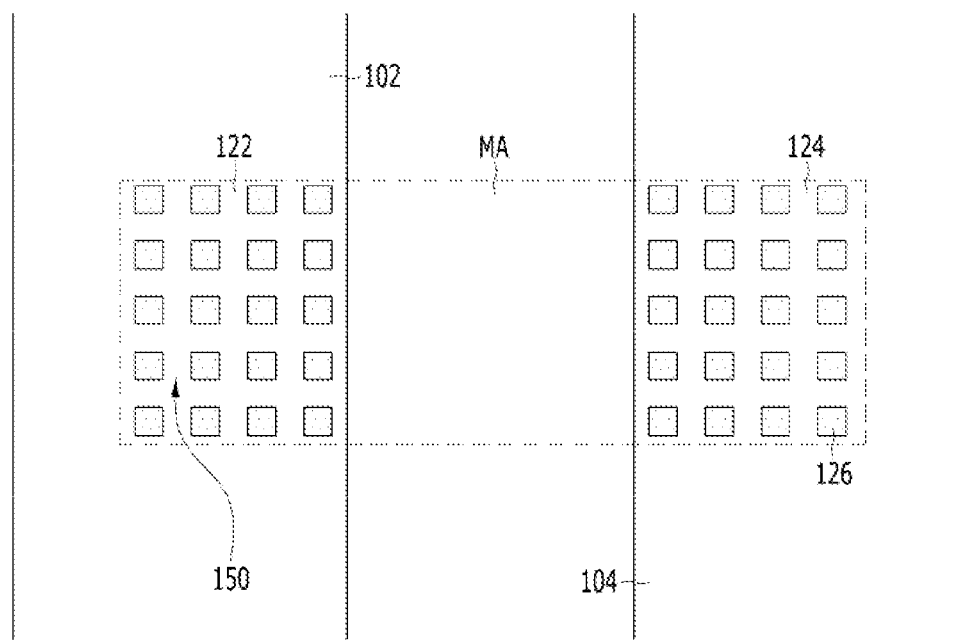
Figure 5D:
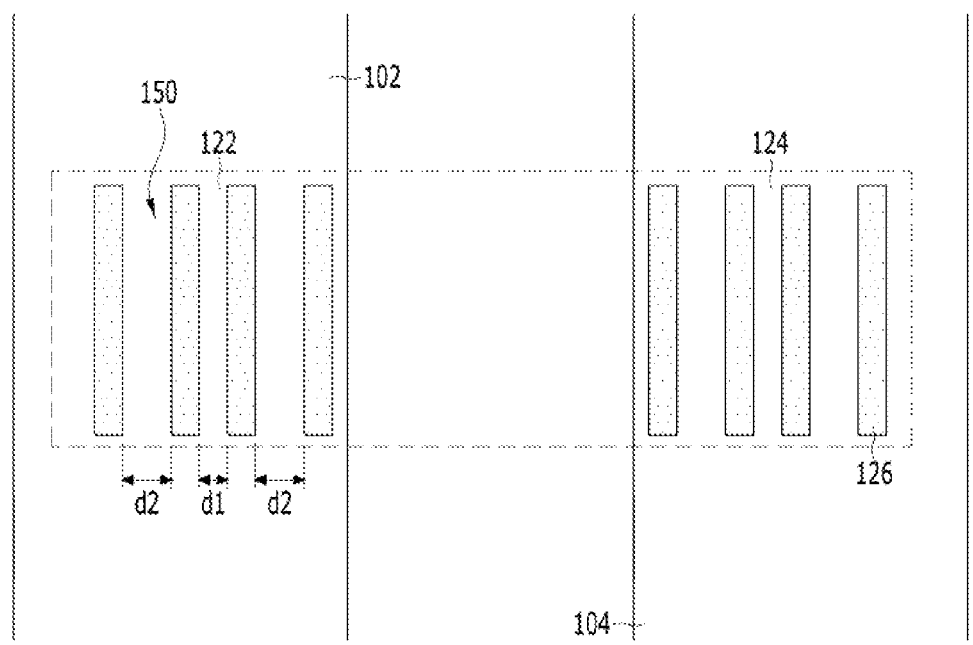

The barrier layer 126 is disposed on each of the first and second electrode pads 122 and 124. In particular, the barrier layer 126 is disposed in the mounting area MA in which the light-emitting chip 130 is mounted. The barrier layer 126 is formed so as to expose at least a portion of each of the first and second electrode pads 122 and 124. For example, as shown in FIG. 5A, the barrier layer 126 may be formed in a mesh shape having at least one slit 150. Alternatively, as shown in FIG. 5B, the barrier layer 126 may be formed in a multiple lines that are spaced apart from one another, with at least one slit 150 interposed therebetween. Alternatively, as shown in FIG. 5C, the barrier layer 126 may be formed in a dot shape. When the slit 150 is provided in a plural number, the intervals between the barrier layers 126 spaced apart from one another, with the slits 150 interposed therebetween, may be uniform, as shown in FIGS. 5A to 5C. Alternatively, as shown in FIG. 5D, the intervals between the barrier layers 126 may be different depending on the positions thereof. For example, the interval d2 between the barrier layers 126 located in the periphery area may be greater than the interval d1 between the barrier layers 126 located in the central area. Accordingly, separation of the light-emitting chips 130 is facilitated in a rework process performed on the light-emitting chips 130.

The barrier layer 126 may be formed in the same mask process as the protective film 116. When formed in the same mask process as the protective film 116, the barrier layer 126 may be made of the same material as the protective film 116, and may be disposed in the same plane as the protective film 116. The barrier layer 126 may be formed of an inorganic insulating material such as silicon nitride (SiNx) and silicon oxide (SiOx), which does not react with the solder 128. The barrier layer 126 may be formed in a single-layered structure or a multi-layered structure. When formed in a multi-layered structure, the barrier layer 126 may be formed by stacking a silicon nitride (SiNx) film and a silicon oxide (SiOx) film. Silicon dioxide (SiO2) may be used for the silicon oxide (SiOx) film.

The barrier layer 126 may be disposed between the solder 128 and a portion of each of the first and second electrode pads 122 and 124. The solder 128 may be in contact with a portion of each of the first and second electrode pads 122 and 124, which is exposed by at least the slit 150 in the barrier layer 126. The contact area between the first and second electrode pads 122 and 124 and the solder 128 may be reduced by the barrier layer 126, which has the slit 150 or is formed in a dot shape. Therefore, the diffusion of the metal (e.g. Cu), included in each of the first and second electrode pads 122 and 124, to the solder 128 can be prevented. Accordingly, even if a soldering process is defective or a process of mounting the light-emitting chip 130 is defective, a rework process can be facilitated. This will be described later in more detail with reference to FIGS. 6A and 6B.

Figure 6A:
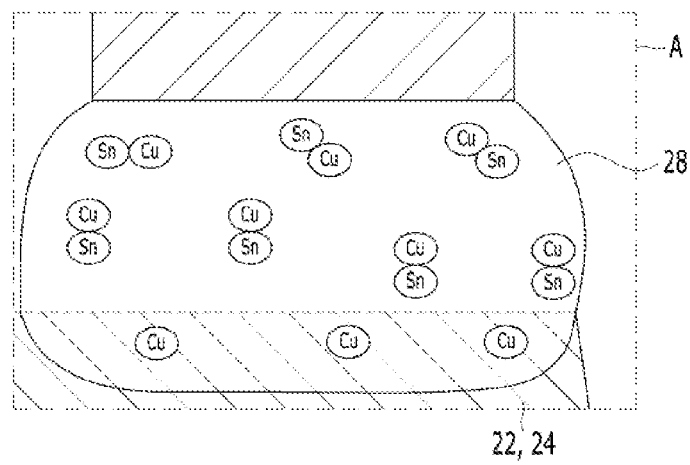
FIG. 6A is a cross-sectional view showing a comparative example including no barrier layer formed in the light emitting plate.
Figure 6B:
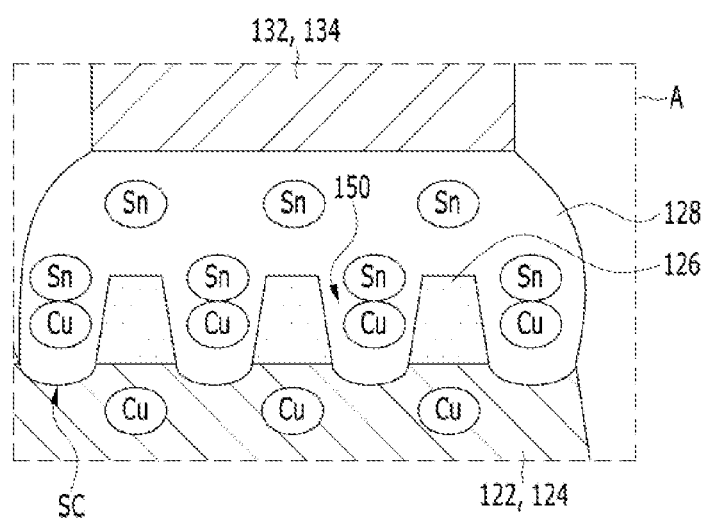
FIG. 6B is a cross-sectional view showing an aspect of the present disclosure including a barrier layer formed in the light emitting plate.

FIG. 6A is a cross-sectional view showing a comparative example including no barrier layer formed in the light emitting plate, and FIG. 6B is a cross-sectional view showing an aspect of the present disclosure including a barrier layer formed in the light emitting plate.

For example, in the case of a comparative example, in which no barrier layer is disposed on first and second electrode pads 22 and 24, which are formed of copper (Cu), the entire area of the upper surface of each of the first and second electrode pads 22 and 24 comes into contact with tin (Sn) included in a molten solder 28 during a soldering process, as shown in FIG. 6A. In this case, copper (Cu) included in the first and second electrode pads 22 and 24 may be dissolved in the molten solder 28, and the dissolved copper (Cu) may be totally diffused to the solder 28. Accordingly, in the case of the comparative example, the first and second electrode pads 22 and 24 are also exfoliated simultaneously with the exfoliation of the solder 28 during the rework process, which makes it impossible to separate the light-emitting chip 130. Therefore, it is impossible to perform rework on the light-emitting chip 130.

In contrast, in the aspect, in which the barrier layer 126 having at least one slit 150 is disposed on each of the first and second electrode pads 122 and 124, which is formed of copper (Cu), copper (Cu) included in the region of each of the first and second electrode pads 122 and 124 that is exposed by the slit 150 may be diffused toward the solder 128. However, copper (Cu) included in the region of each of the first and second electrode pads 122 and 124 that is not exposed by the barrier layer 126 is not diffused toward the solder 128, but is left behind under the barrier layer 126, as shown in FIG. 6B. In this case, when the solder 128 is exfoliated for the rework process, copper (Cu) included in each of the first and second electrode pads 122 and 124, which overlaps with the barrier layer 126, is left behind without being exfoliated. Accordingly, it is possible to perform rework on the soldering process and the process of mounting the light-emitting chip 130 through the left-behind copper (Cu) metal in each of the first and second electrode pads 122 and 124. After the rework process, a portion of each of the first and second electrode pads 122 and 124, which overlaps with the barrier layer 126 of the completely formed light-emitting plate 100, may have a flat surface. On the other hand, the remaining portion of each of the first and second electrode pads 122 and 124, which is exposed without overlapping with the barrier layer 126, may have an uneven-shaped or concave lens-shaped surface SC. Accordingly, after the rework process, the solder 128 is also in contact with the uneven-shaped or concave lens-shaped side surfaces of the first and second electrode pads 122 and 124.

Figure 7:
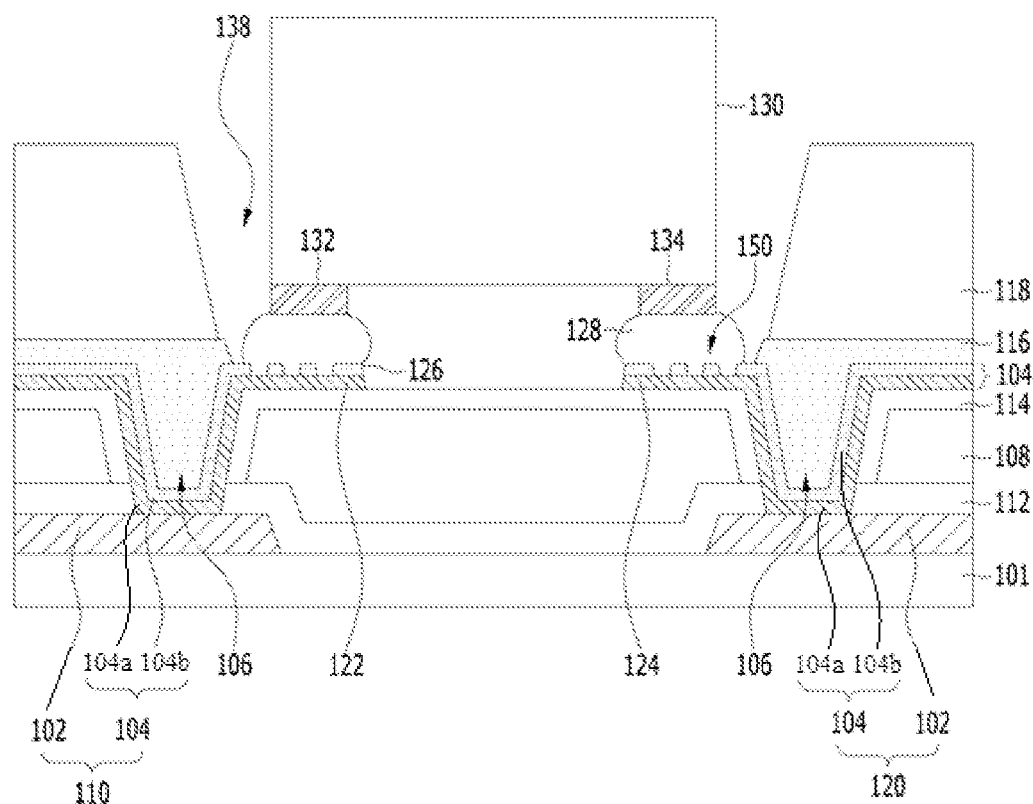
FIG. 7 is a cross-sectional view showing a light-emitting plate of a liquid crystal display module according to a second aspect of the present disclosure.

FIG. 7 is a cross-sectional view showing a light-emitting plate 100 according to a second aspect of the present disclosure.

The light-emitting plate 100 shown in FIG. 7 includes the same components as the light-emitting plate 100 shown in FIG. 4 except that a barrier layer 126 is formed of a conductive material. Therefore, a detailed description of the same components will be omitted.

Each of the first and second electrode pads 122 and 124 includes an upper conductive layer 104 that has a multi-layered structure.

For example, the upper conductive layer 104 may be formed in a multi-layered structure including first and second conductive layers 104a and 104b. At least one of the first conductive layer 104a or the second conductive layer 104b is formed in a single-layered structure or a multi-layered structure including one of aluminum (Al), copper (Cu), silver (Ag), gold (Au), molybdenum (Mo), titanium (Ti), indium tin oxide (ITO), indium zinc oxide (IZO), and an alloy including any of these elements as a main component. For example, the second conductive layer 104b disposed on the first conductive layer 104a may be formed of molybdenum-titanium alloy (MoTi) that does not react with the solder 128, and the first conductive layer 104a may be formed of copper (Cu).

The barrier layer 126 may be disposed on the first conductive layer 104a, and may have at least one slit 150 or a dot pattern. A portion of the first conductive layer 104a may be exposed by the slit 150 or the dot pattern of the barrier layer 126. The barrier layer 126 may be formed in the same mask process as the second conductive layer 104b. When formed in the same mask process as the second conductive layer 104b, the barrier layer 126 may be made of the same material as the second conductive layer 104b, and may be disposed at the same plane as the second conductive layer 104b.

Figure 8A:
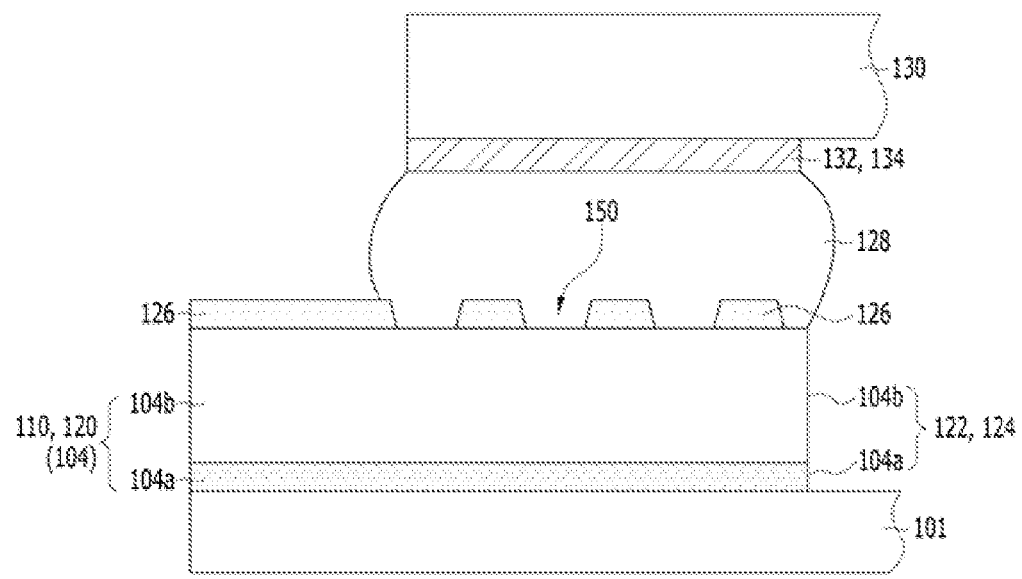
FIGS. 8A and 8B are cross-sectional views showing aspects of the driving electrode according to a third aspect of the present disclosure.
Figure 8B:
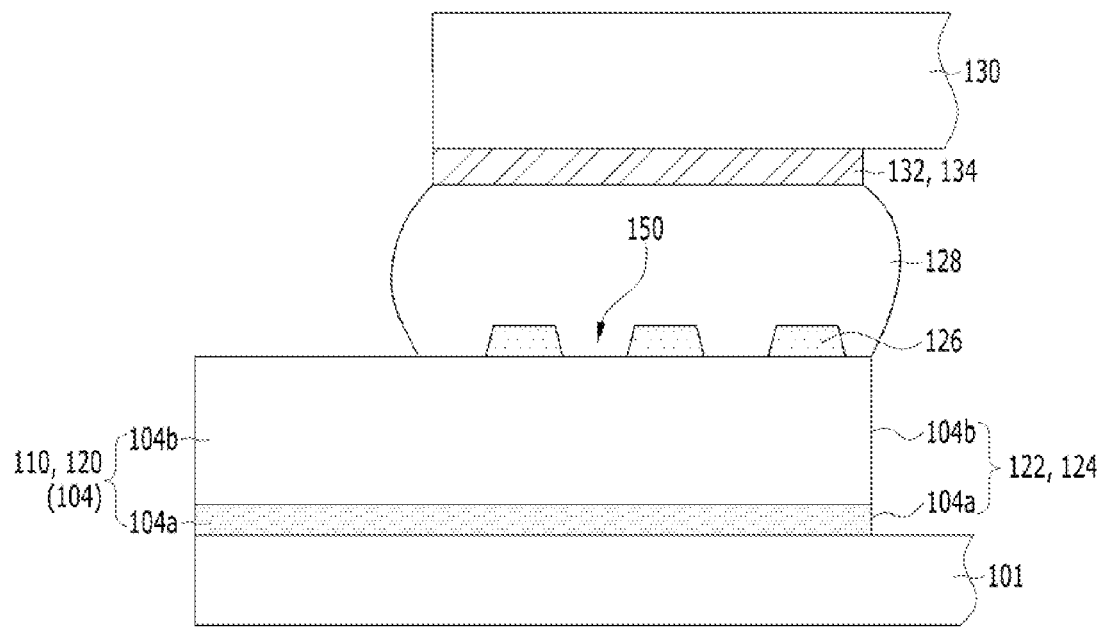

FIGS. 8A and 8B are cross-sectional views showing aspects of the driving electrode according to a third aspect of the present disclosure.

As shown in FIG. 8A, the upper conductive layer 104 may be formed in a multi-layered structure including first and second conductive layers 104a and 104b. At least one of the first and second conductive layers 104a and 104b is formed in a single-layered structure or a multi-layered structure including one of aluminum (Al), copper (Cu), silver (Ag), gold (Au), molybdenum (Mo), titanium (Ti), indium tin oxide (ITO), indium zinc oxide (IZO), and an alloy including any of these elements as a main component.

For example, the first conductive layer 104a may be formed of molybdenum-titanium alloy (MoTi) that does not react with the solder 128. The second conductive layer 104b disposed on the first conductive layer 104a may be formed of copper (Cu).

The barrier layer 126 may be disposed on the second conductive layer 104b of the first and second electrode pads 122 and 124, and may be formed of a conductive material that does not react with the solder 128. For example, the barrier layer 126 is formed of the same material as the first conductive layer 104a, and thus does not react with the solder 128. Accordingly, even when a portion of the second conductive layer 104b reacts with the solder 128 and is lost, the barrier layer 126 and the first conductive layer 104a are left behind, thus the rework process can be performed due to the barrier layer 126 and the first conductive layer 104a.

As shown in FIG. 8B, the upper conductive layer 104 of each of the first and second driving electrodes 110 and 120 may be composed of the first and second conductive layers 104a and 104b.

For example, the first conductive layer 104a may be formed of molybdenum-titanium alloy (MoTi), which does not react with the solder 128. The second conductive layer 104b disposed on the first conductive layer 104a may be formed of copper (Cu).

As shown in FIG. 4, the barrier layer 126 may be formed in the same mask process as the protective film 116. When formed in the same mask process as the protective film 116, the barrier layer 126 may be made of the same material as the protective film 116, and may be disposed in the same plane as the protective film 116. The barrier layer 126 may be formed of an inorganic insulating material such as silicon nitride (SiNx) and silicon oxide (SiOx) that does not react with the solder 128. The barrier layer 126 may be formed in a single-layered structure or a multi-layered structure. When formed in a multi-layered structure, the barrier layer 126 may be formed by stacking a silicon nitride (SiNx) film and a silicon oxide (SiOx) film. Silicon dioxide ($SiO_2$) may be used for the silicon oxide (SiOx) film.

Figure 9A:
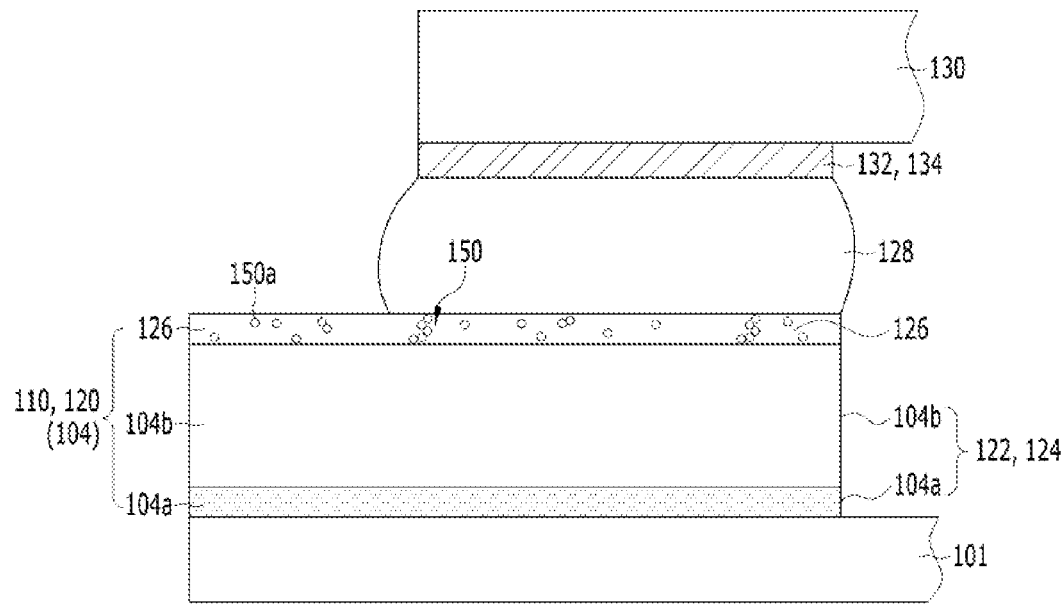
FIGS. 9A and 9B are cross-sectional views showing a light-emitting plate of a liquid crystal display module according to a fourth aspect of the present disclosure.
Figure 9B:
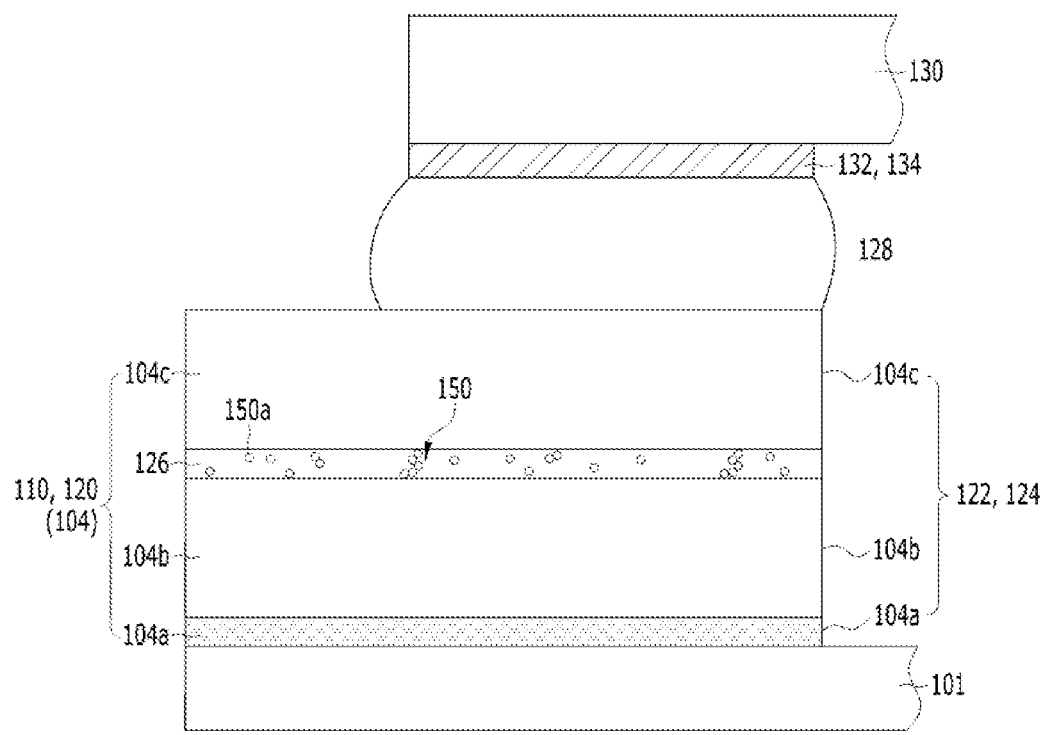

FIGS. 9A and 9B are cross-sectional views respectively showing a light-emitting plate and a driving electrode according to a fourth aspect of the present disclosure. The first conductive layer 104a may be formed of molybdenum-titanium alloy (MoTi) that does not react with the solder 128. The second conductive layer 104b disposed on the first conductive layer 104a may be formed of copper (Cu).

The light-emitting plate and the driving electrode shown in FIGS. 9A and 9B includes the same components as the light-emitting plate shown in FIG. 4 except that a barrier layer 126 is formed of a porous material. Therefore, a detailed description of the same components will be omitted.

The barrier layer 126 having porosity may be disposed on the entire surface of the second conductive layer 104b of each of the first and second electrode pads 122 and 124. Multiple pores 150a present in the barrier layer 126 are combined to form at least one slit 150 or a dot pattern, so a portion of the second conductive layer 104b disposed under the barrier layer 126 is exposed by the at least one slit 150.

The barrier layer 126 may be disposed on the first and second electrode pads 122 and 124, and may be formed of a conductive material, which does not react with the solder. For example, the barrier layer 126 is formed of the same material as the first conductive layer 104a, and thus does not react with the solder 128. In this case, in the same area, the density of the first conductive layer 104a, which includes no pores, is higher than that of the barrier layer 126, which includes the pores 150a.

Meanwhile, as shown in FIG. 9B, a third conductive layer 104c may be disposed on the barrier layer 126. The third conductive layer 104c may be formed of a material that easily reacts with the solder 128. For example, the third conductive layer 104c may be formed of the same material as the second conductive layer 104b. In this case, even when the third conductive layer 104c reacts with the solder 128, is diffused to the solder 128, and thus is lost during the rework process, the barrier layer 126 and the first conductive layer 104a are left behind. The rework process therefore can be performed due to the barrier layer 126 and the first conductive layer 104a.

The upper conductive layer 104 of each of the first and second driving electrodes 110 and 120 may include the barrier layer 126, or may be composed of at least one of the first to third conductive layers 104a, 104b and 104c without a barrier layer.

Figure 10:
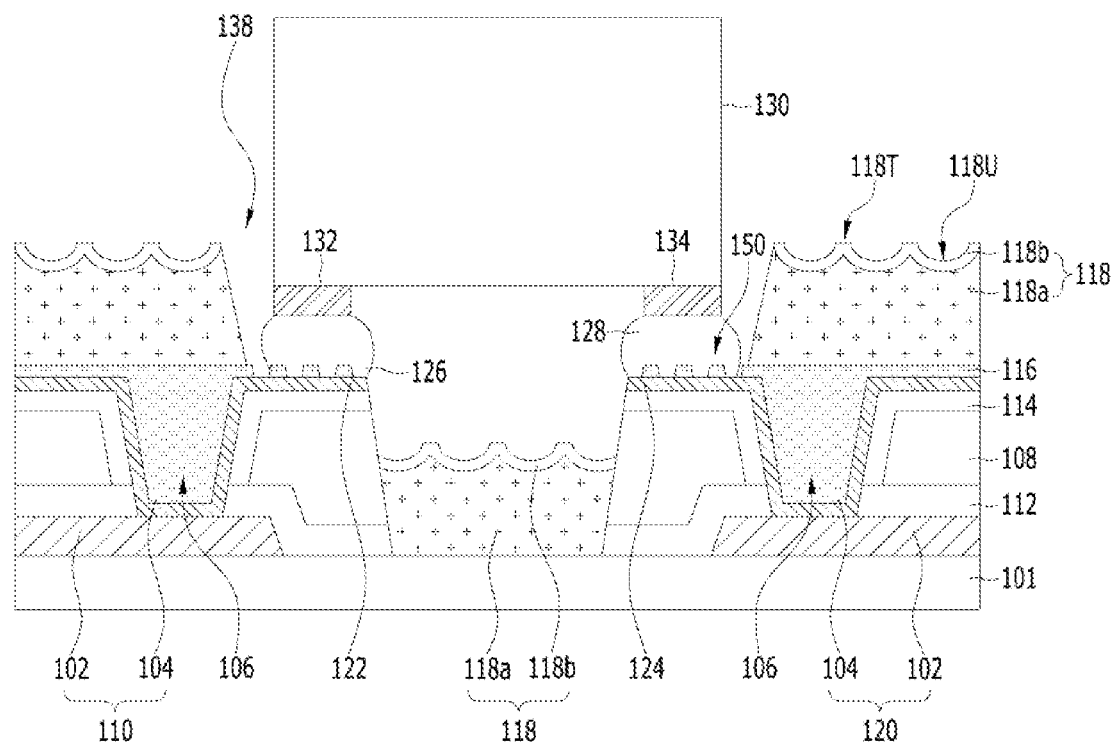
FIG. 10 is a cross-sectional view showing a light-emitting plate of a liquid crystal display module according to a fifth aspect of the present disclosure.

FIG. 10 is a cross-sectional view showing a light-emitting plate according to a fifth aspect of the present disclosure.

The light-emitting plate shown in FIG. 10 includes the same components as the light-emitting plate shown in FIG. 4 except that a reflective layer 118 is formed in an uneven shape. Therefore, a detailed description of the same components will be omitted.

The reflective layer 118 may include a reflective organic layer 118a and a reflective metal layer 118b, which are sequentially stacked on a protective film 116.

The reflective organic layer 118a is formed in an uneven shape on the protective film 116. The reflective organic layer 118a may be formed of an organic insulating material such as photo-acryl.

The reflective metal layer 118b is disposed on the reflective organic layer 118a, and is formed in an uneven shape along the uneven shape of the reflective organic layer. The reflective metal layer 118b is formed in a single-layered structure or a multi-layered structure including one of silver (Ag), copper (Cu), aluminum (Al), molybdenum (Mo), titanium (Ti), and an alloy thereof. For example, the reflective metal layer 118b may be formed in a three-layered structure in which indium tin oxide (ITO), silver (Ag), and indium tin oxide (ITO) are sequentially stacked. The reflective layer 118, which includes the reflective organic layer 118a and the reflective metal layer 118b, may be disposed under the light-emitting chips 130 as well as between the light-emitting chips 130. In the uneven-shaped reflective layer 118, the width or diameter of a concave portion 118U may be greater than the width of a convex portion 118T. The width or diameter of the concave portion 118U is two to three times the width of the convex portion 118T. If the width or diameter of the concave portion 118U exceeds three times the width of the convex portion 118T, this causes serious mura defects, and reduces diffuse reflectance. Therefore, the relationship between the width or diameter of the concave portion 118U and the width of the convex portion 118T is as follows. The width or diameter of the concave portion 118U is greater than the width of the convex portion 118T, and does not exceed three times the width of the convex portion 118T.

Since the uneven-shaped reflective layer 118 causes diffuse reflection of the light generated by the light-emitting chip 130, front light intensity is increased, and luminance is increased.

FIGS. 11A to 11F are cross-sectional views showing a method of manufacturing the light-emitting plate according to the present disclosure. The method of manufacturing the light-emitting plate according to the present disclosure will be described based on the structure of the light-emitting plate shown in FIG. 4.

Figure 11A:
FIGS. 11A to 11F are cross-sectional views showing a method of manufacturing the light-emitting plate shown in FIG. 4.

As shown in FIG. 11A, a metal layer is deposited on a substrate 101, and is then patterned through a photolithography process and an etching process to form a first driving electrode 102. At this time, the first driving electrode 102 is formed in a single-layered structure or a multi-layered structure including one of aluminum (Al), copper (Cu), silver (Ag), gold (Au), chromium (Cr), tungsten (W), molybdenum (Mo), titanium (Ti), and an alloy including one of the elements as a main component. For example, the first driving electrode 102 may be formed in a two-layered structure in which molybdenum-titanium alloy (MoTi) and copper (Cu) are sequentially stacked.

Figure 11B:

As shown in FIG. 11B, an inorganic insulating material, such as SiNx and SiOx, is deposited on the entire surface of the substrate 101 on which the first driving electrode 102 has been formed, thereby forming a first insulating film 112. Subsequently, an organic insulating material, such as photo-acryl, is applied on the first insulating film 112, and is then patterned through a photolithography process, thereby forming a planarization layer 108. At this time, the planarization layer 108 is disposed on the first insulating film 112 so as to expose the portion of the upper surface of the first insulating film 112 that overlaps the first driving electrode 102.

Figure 11C:
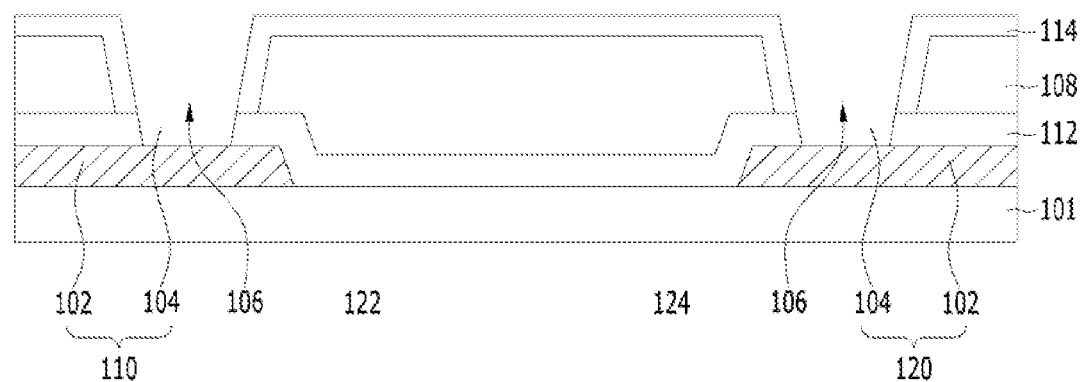

As shown in FIG. 11C, an inorganic insulating material, such as SiNx and SiOx, is deposited on the entire surface of the substrate 101 on which the planarization layer 108 has been formed, thereby forming a second insulating film 114. Thereafter, the first and second insulating films 112 and 114 are patterned through a photolithography process and an etching process, thereby forming a contact hole 106. The contact hole 106 penetrates the first and second insulating films 112 and 114 to expose the first driving electrode 102.

Figure 11D:
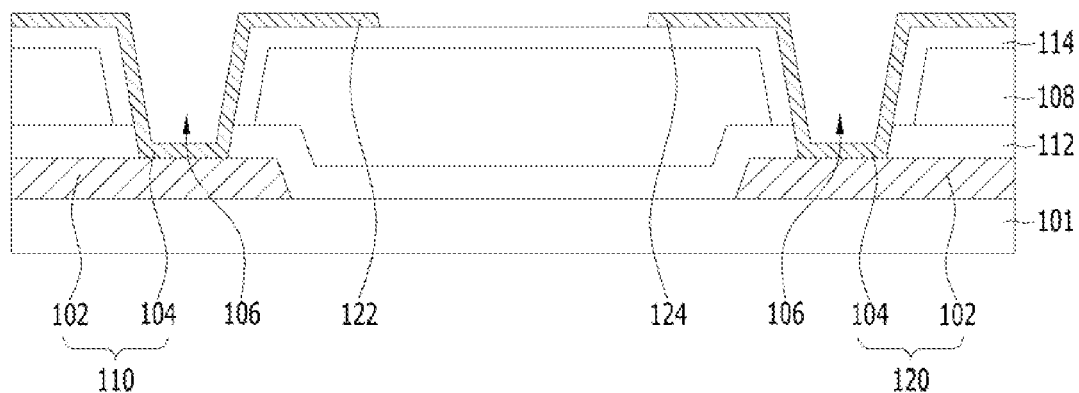

As shown in FIG. 11D, a metal layer is deposited on the substrate 101 in which the contact hole 106 is formed, and is then patterned through a photolithography process and an etching process, thereby forming a second driving electrode 104 and first and second electrode pads 122 and 124. At this time, each of the second driving electrode 104 and the first and second electrode pads 122 and 124 is formed in a single-layered structure or a multi-layered structure including one of aluminum (Al), copper (Cu), silver (Ag), gold (Au), chromium (Cr), tungsten (W), molybdenum (Mo), titanium (Ti), and an alloy including one of the elements as a main component. For example, each of the second driving electrode 104 and the first and second electrode pads 122 and 124 may be formed in a two-layered structure in which molybdenum-titanium alloy (MoTi) and copper (Cu) are sequentially stacked. However, such a structure is not limited thereto. For example, each of the second driving electrode 104 and the first and second electrode pads 122 and 124 may be formed in a four-layered structure in which molybdenum-titanium alloy (MoTi), copper (Cu), silver (Ag), and copper (Cu) are sequentially stacked. Alternatively, each of the second driving electrode 104 and the first and second electrode pads 122 and 124 may be formed in a three-layered structure in which molybdenum-titanium alloy (MoTi), copper (Cu), and molybdenum-titanium alloy (MoTi) are sequentially stacked. Alternatively, each of the second driving electrode 104 and the first and second electrode pads 122 and 124 may be formed in a four-layered structure in which molybdenum-titanium alloy (MoTi), copper (Cu), molybdenum-titanium alloy (MoTi), and copper (Cu) are sequentially stacked.

Figure 11E:
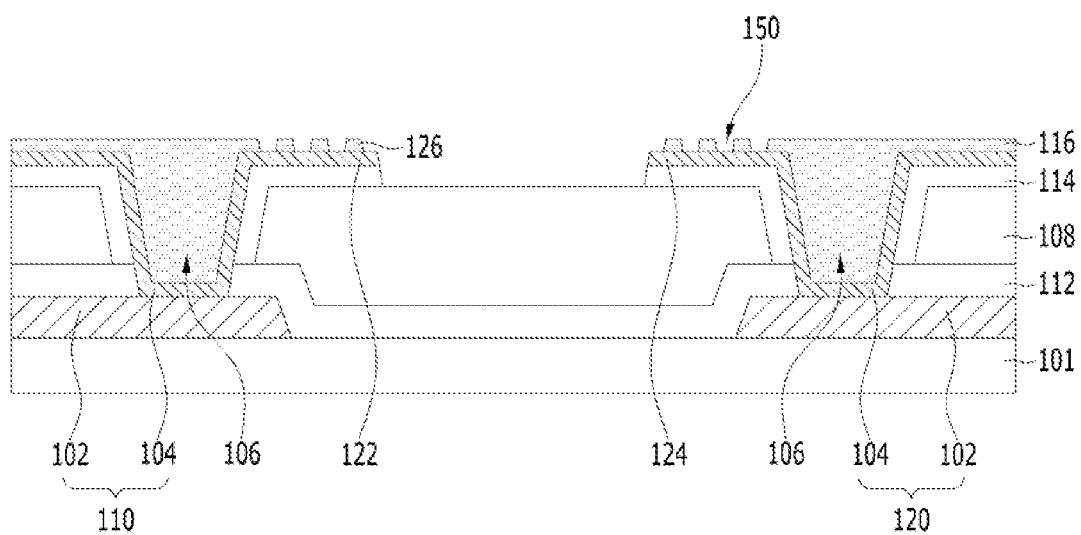

As shown in FIG. 11E, an inorganic insulating material, such as silicon nitride (SiNx) and silicon oxide (SiOx), is deposited on the entire surface of the substrate 101 on which the second driving electrode 104 has been formed, and is then patterned through a photolithography process and an etching process, thereby forming a protective film 116 and a barrier layer 126. The protective film 116 may be disposed on the second driving electrode 104, and the barrier layer 126 may be disposed on the first and second electrode pads 122 and 124 and may be formed to have at least one slit 150 or a dot pattern shown in FIG. 5C.

Figure 11F:
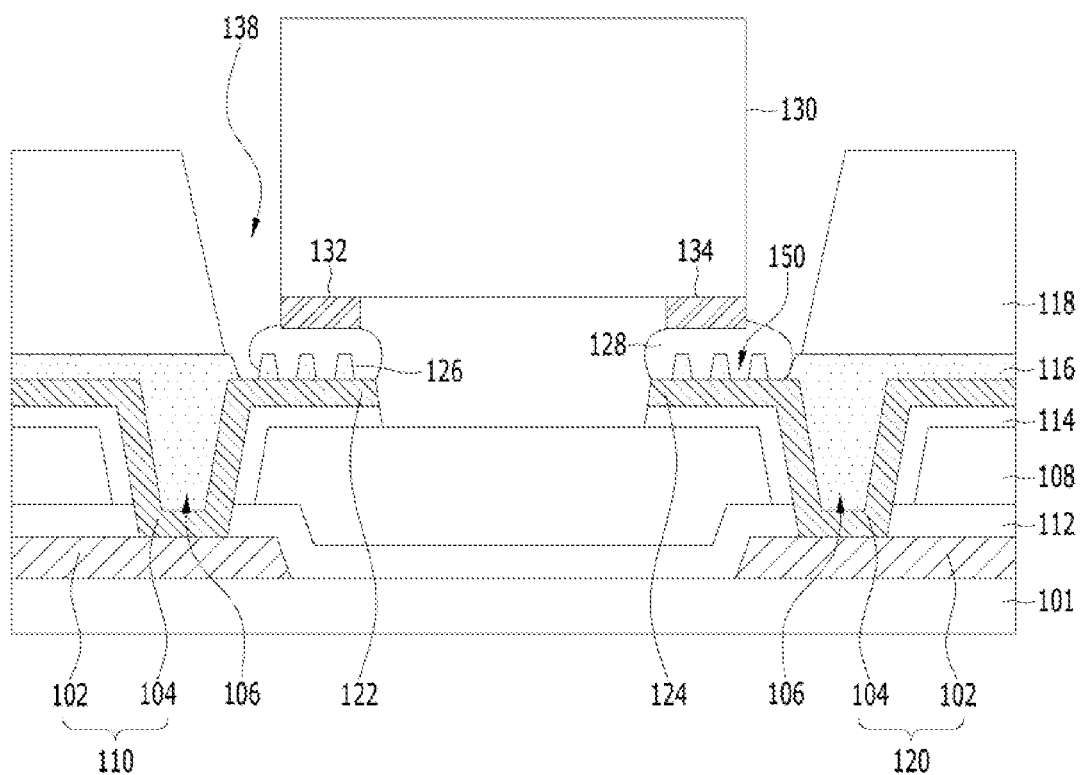

As shown in FIG. 11F, a reflective film is formed on the substrate 101 on which the protective film 116 and the barrier layer 126 have been formed, and is then patterned through a photolithography process and an etching process, thereby forming a through-hole 138 corresponding to an area in which a light-emitting chip is mounted. Subsequently, a light-emitting chip 130 is mounted on the first and second electrode pads 122 and 124 through a soldering process, thereby completely manufacturing the light-emitting plate.

Meanwhile, although the present disclosure has been described based on the exemplary aspect in which a light-emitting plate is applied to a backlight unit of a liquid crystal display device, a light-emitting plate may also be applied to a lighting device.

As is apparent from the above description, according to the present disclosure, a barrier layer having a slit is disposed between a solder and an electrode pad. Accordingly, a portion of the solder is in contact with the barrier layer, and the remaining portion of the solder is in contact with the portion of the electrode pad that is exposed by the slit, thereby reducing the contact area between the solder and the electrode pad. As a result, the electrode pad overlapping the barrier layer is left behind without being diffused into the solder, whereby it is possible to perform rework on a process of mounting a light-emitting chip using the left-behind electrode pad.

In addition, the present disclosure enables a reduction in the thickness of a backlight unit, in which a light-emitting chip is mounted on a substrate, which is thinner than a conventional printed circuit board.

It will be apparent to those skilled in the art that various modifications and variations can be made in the present disclosure without departing from the spirit or scope of the disclosure. Thus, it is intended that the present disclosure covers the modifications and variations of this disclosure provided they come within the scope of the appended claims and their equivalents.

What is claimed is:

1. A backlight unit comprising:
an electrode pad disposed at a substrate;
a driving electrode disposed on the substrate and electrically connected with the electrode pad;
a protective film disposed on the driving electrode, exposing a portion of the electrode pad,
a plurality of light-emitting chips mounted at the substrate;
a solder disposed between the electrode pad and the plurality of light-emitting chips; and
a barrier layer having at least one slit exposing a portion of the electrode pad and disposed between the electrode pad and the solder,
wherein the barrier layer is formed of a same material and disposed at a same plane as the protective film that is formed of an inorganic insulating material.

2. The backlight unit according to claim 1, wherein the barrier layer has a reactivity with the solder lower than the electrode pad.

3. The backlight unit according to claim 1, wherein the barrier layer and the protective film are formed of silicon nitride (SiNx) or silicon oxide (SiOx).

4. The backlight unit according to claim 1, wherein the electrode pad is formed as a multi-layered structure, and
wherein the barrier layer is disposed on the electrode pad and is formed of a same material as one of multiple layers of the electrode pad.

5. The backlight unit according to claim 4, wherein the barrier layer is formed as a single-layered structure or a multi-layered structure including one of molybdenum-titanium alloy (MoTi), titanium (Ti), molybdenum (Mo), silver (Ag), and an alloy thereof.

6. The backlight unit according to claim 4, wherein the electrode pad includes first and second conductive layers sequentially stacked,
wherein each of the barrier layer and the first conductive layer is formed as a single-layered structure or a multi-layered structure including at least one of molybdenum-titanium alloy (MoTi), titanium (Ti), molybdenum (Mo), and silver (Ag), and
wherein the second conductive layer is formed as a single-layered structure or a multi-layered structure including copper (Cu).

7. The backlight unit according to claim 6, further comprising a third conductive layer disposed on the barrier layer,
wherein the third conductive layer is formed of a same material as the second conductive layer.

8. The backlight unit according to claim 6, wherein the barrier layer includes multiple pores that are combined to form the at least one slit.

9. The backlight unit according to claim 8, wherein the barrier layer has a density lower than that of the first conductive layer.

10. The backlight unit according to claim 1, further comprising a reflective layer having an uneven shape and disposed between the plurality of light-emitting chips and under the plurality of light-emitting chips.

11. The backlight unit according to claim 1, wherein a portion of an upper surface of the electrode pad that overlaps with the barrier layer has a flat surface, and
wherein a portion of the upper surface of the electrode pad that does not overlap with the barrier layer has a non-flat surface.

12. The backlight unit according to claim 1, wherein the electrode pad includes first and second conductive layers sequentially stacked,
wherein the first conductive layer is formed in a single-layered structure or a multi-layered structure using copper (Cu), and the second conductive layer is formed in a single-layered structure or a multi-layered structure using at least one of molybdenum-titanium alloy (MoTi), titanium (Ti), molybdenum (Mo) and silver (Ag), and
wherein the barrier layer is formed of a same layer as the second conductive layer.

13. The backlight unit according to claim 12, wherein the barrier layer is formed by patterning the second conductive layer.

14. A backlight unit comprising:
an electrode pad disposed on a substrate;
a driving electrode disposed on the substrate and electrically connected with the electrode pad;
a protective film disposed on the driving electrode, exposing a portion of the electrode pad,
a plurality of light-emitting chips mounted on the substrate;

a solder disposed between the electrode pad and the plurality of light-emitting chips; and a barrier layer disposed on the electrode pad and having a lower reactivity with the solder than the electrode pad, wherein the barrier layer is formed of a same material and disposed at a same plane as the protective film that is formed of an inorganic insulating material.

15. The backlight unit according to claim 14, wherein the barrier layer has at least one slit.

16. The backlight unit according to claim 14, wherein the barrier layer is formed of a porous material having a plurality of pores.

17. A display device comprising:
a display panel; and
a backlight unit configured to radiate light to the display panel,
wherein the backlight unit comprises:
an electrode pad disposed on a substrate;
a driving electrode disposed on the substrate and electrically connected with the electrode pad;
a protective film disposed on the driving electrode, exposing a portion of the electrode pad,
a plurality of light-emitting chips mounted on the substrate;
a solder disposed between the electrode pad and the plurality of light-emitting chips; and
a barrier layer disposed on the electrode pad and having a lower reactivity with the solder than the electrode pad,
wherein the barrier layer is formed of a same material and disposed at a same plane as the protective film that is formed of an inorganic insulating material.

18. The display device according to claim 17, wherein the barrier layer has at least one slit.

19. The display device according to claim 17, wherein the barrier layer is formed of a porous material having pores.

20. A backlight unit comprising:
an electrode pad disposed at a substrate;
a driving electrode disposed on the substrate and electrically connected with the electrode pad;
a protective film disposed on the driving electrode, exposing a portion of the electrode pad,
at least one light-emitting chip mounted at the substrate;
a solder electrically connecting the electrode pad and the at least one light-emitting chip; and
a rework mount unit disposed on the electrode pad and preventing a portion of the solder from contacting the electrode pad that provides at least some space where the solder does not contact the electrode pad for use in a rework process for repairing a defective light-emitting chip or a defective solder,
wherein the rework mount unit is formed of a same material and disposed at a same plane as the protective film that is formed of an inorganic insulating material.

21. The backlight unit according to claim 20, wherein the rework mount unit has at least one slit that exposes a portion of the electrode pad to the solder.

22. The backlight unit according to claim 20, wherein the rework mount unit is formed of a porous material having a plurality of pores that exposes a portion of the electrode pad to the solder.

23. The backlight unit according to claim 20, wherein the rework mount unit has a reactivity with the solder lower than the electrode pad.

24. The backlight unit according to claim 20, further comprising a reflective layer having an uneven shape and disposed between the plurality of light-emitting chips and under the plurality of light-emitting chips.

* * * * *